United States Patent
Tsai et al.

(10) Patent No.: US 9,104,374 B2
(45) Date of Patent: Aug. 11, 2015

(54) ELECTRONIC DEVICE

(71) Applicants: Hui-Jou Tsai, Taipei (TW); Yung-Hsiang Chen, Taipei (TW); Wen-Yi Chiu, Taipei (TW); Kuan-Yu Chou, Taipei (TW); Chuan-Hao Wen, Taipei (TW); Chun-Huang Yu, Taipei (TW); Chao-Tung Hsu, Taipei (TW); Chih-Yin Lai, Taipei (TW); Chia-Sheng Liu, Taipei (TW); Hsiang-Ling Liu, Taipei (TW)

(72) Inventors: Hui-Jou Tsai, Taipei (TW); Yung-Hsiang Chen, Taipei (TW); Wen-Yi Chiu, Taipei (TW); Kuan-Yu Chou, Taipei (TW); Chuan-Hao Wen, Taipei (TW); Chun-Huang Yu, Taipei (TW); Chao-Tung Hsu, Taipei (TW); Chih-Yin Lai, Taipei (TW); Chia-Sheng Liu, Taipei (TW); Hsiang-Ling Liu, Taipei (TW)

(73) Assignee: COMPAL ELECTRONICS, INC., Taipei (TW)

( * ) Notice: Subject to any disclaimer, the term of this patent is extended or adjusted under 35 U.S.C. 154(b) by 190 days.

(21) Appl. No.: 13/723,124

(22) Filed: Dec. 20, 2012

(65) Prior Publication Data
US 2013/0201617 A1    Aug. 8, 2013

Related U.S. Application Data

(60) Provisional application No. 61/596,707, filed on Feb. 8, 2012.

(51) Int. Cl.
*G06F 1/16*    (2006.01)
*H05K 5/02*    (2006.01)

(52) U.S. Cl.
CPC .......... *G06F 1/1633* (2013.01); *G06F 1/1616* (2013.01); *G06F 1/1675* (2013.01); *H05K 5/0217* (2013.01)

(58) Field of Classification Search
CPC ..... G06F 1/1618; G06F 1/162; G06F 1/1622; G06F 1/1632; G06F 1/1643
USPC .............................. 361/679.28, 679.3, 679.4
See application file for complete search history.

(56) References Cited

U.S. PATENT DOCUMENTS

| | | | | |
|---|---|---|---|---|
| 6,304,431 | B1 * | 10/2001 | Kim | 361/679.09 |
| 6,700,773 | B1 * | 3/2004 | Adriaansen et al. | 361/679.08 |
| 7,894,184 | B2 * | 2/2011 | Huang et al. | 361/679.48 |

FOREIGN PATENT DOCUMENTS

| | | |
|---|---|---|
| TW | 292371 | 12/1996 |
| TW | M431359 | 6/2012 |

* cited by examiner

*Primary Examiner* — Anthony Haughton
(74) *Attorney, Agent, or Firm* — Jianq Chyun IP Office

(57) ABSTRACT

An electronic device including a first body, an input module and a functional element is provided. The input module is movably disposed on the first body and adapted to be moved between a first position and a second position. The functional element is disposed on the input module. When the input module is located at the first position, the functional element is concealed in the first body. When the input module is located at the second position, the functional element is exposed outside the first body.

10 Claims, 5 Drawing Sheets

ELECTRONIC DEVICE

CROSS-REFERENCE TO RELATED APPLICATION

This application claims the priority benefits of U.S. provisional application Ser. No. 61/596,707, filed on Feb. 8, 2012. The entirety of the above-mentioned patent applications is hereby incorporated by reference herein and made a part of this specification.

BACKGROUND OF THE INVENTION

1. Field of the Invention

The invention relates to an electronic device, more particularly to an electronic device having an input module.

2. Description of Related Art

With rapid development in technology and the availability of various portable devices, users are able to receive and send data at any time and anywhere with portable devices such as notebook computers, smart phones, tablet PCs, and etc.

Take notebook computers as an example, most notebook computers are equipped with functional elements such as a connection port for the users to plug in an external device or a connection wire. Since the connection port is mostly disposed on the side of the notebook computer, the side of the casing certainly has to be thicker than the connection port in order to completely cover the connection port. As a result, current designs of the connection port directly restrict the development of light and slim notebook computers. In addition, the connection port is mostly exposed on the side of the notebook computers and therefore is likely to be contaminated by dirt or liquid. Besides, the appearance of the notebook computers is also affected.

SUMMARY OF THE INVENTION

The invention provides an electronic device which is advantageous for light and slim design, prevents a functional element from being contaminated by dirt or liquid, and has a better appearance.

The invention provides an electronic device, including a first body, an input module, and a functional element. The input module is movably disposed on the first body and adapted to be moved between a first position and a second position. The functional element is disposed on the input module. When the input module is located at the first position, the functional element is concealed in the first body. When the input module is located at the second position, the functional element is exposed outside the first body.

In one embodiment of the invention, the input module is a keyboard.

In one embodiment of the invention, the functional element is a connection port.

In one embodiment of the invention, the electronic device further includes a second body, wherein the second body is pivoted to the first body. When the second boy covers the first body, the input module is located at the first position; when the second body rotates relative to the first body so that an included angle between the second body and the first body is greater than a specific angle, the second body drives the input module to move to the second position.

In one embodiment of the invention, the input module is pivoted to the first body and has an input surface. Moreover, the input module is adapted to rotate relative to the first body from the first position to the second position so as to drive the input surface to be tilted.

In one embodiment of the invention, the input module has a side surface and the functional element is disposed on the side surface. When the input module is located at the first position, the side surface is located in the first body; when the input module is moved from the first position to the second position, the input module drives the sides surface to rise relative to the first body and then to be exposed outside the first body.

In one embodiment of the invention, the electronic device further includes a flexible printed circuit (FPC) connected between the functional element and the first body.

In one embodiment of the invention, the electronic device further includes a fan, wherein the fan is fixed on the first body or the input module. An end of the fan has a flexible cover body which is connected between the first body and the input module and has an outlet. Moreover, when the input module is moved from the first position to the second position, the flexible cover body is expanded and then the outlet is enlarged.

In one embodiment of the invention, the electronic device further includes a speaker, wherein the speaker is fixed on the first body or the input module. An end of the speaker has a flexible cover body which is connected between the first body and the input module and has a sound export. Moreover, when the input module is moved from the first position to the second position, the flexible cover body is expanded and then the sound export is enlarged.

In one embodiment of the invention, the input module includes an input module main body and a shell body. The shell body is movably connected to the first body, wherein the input module main body and the functional element are fixed on the shell body.

Based on the above, the functional element of the invention is disposed on the input module which may be moved relative to the body of the electronic device, so that the functional element may be concealed in the body of the electronic device or be exposed outside the body via the movement of the input module. Accordingly, users may allow the functional element to be exposed outside the body of the electronic device when they would like to use the functional element, and allow the functional element to be concealed in the body of the electronic device when the functional element is not in use, so as to prevent the functional element from being contaminated by dirt or liquid as well as to allow the electronic device to have a better appearance. In addition, since the functional element is not disposed on the side surface of the body of the electronic device, the side surface of the body of the electronic device may have a smaller thickness to be advantageous for light and slim design.

In order to make the aforementioned features and advantages of the invention more comprehensible, embodiments accompanying figures are described in detail below.

DESCRIPTION OF EMBODIMENTS

Figure 1A:
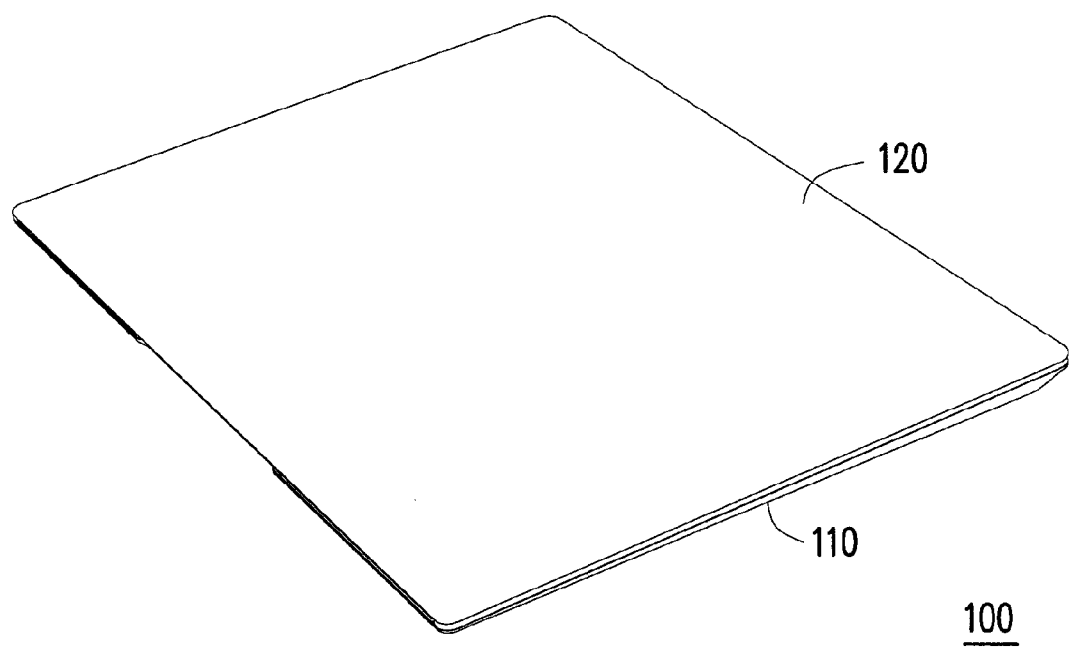
FIG. 1A is a stereogram of an electronic device in one embodiment of the invention.
Figure 1B:
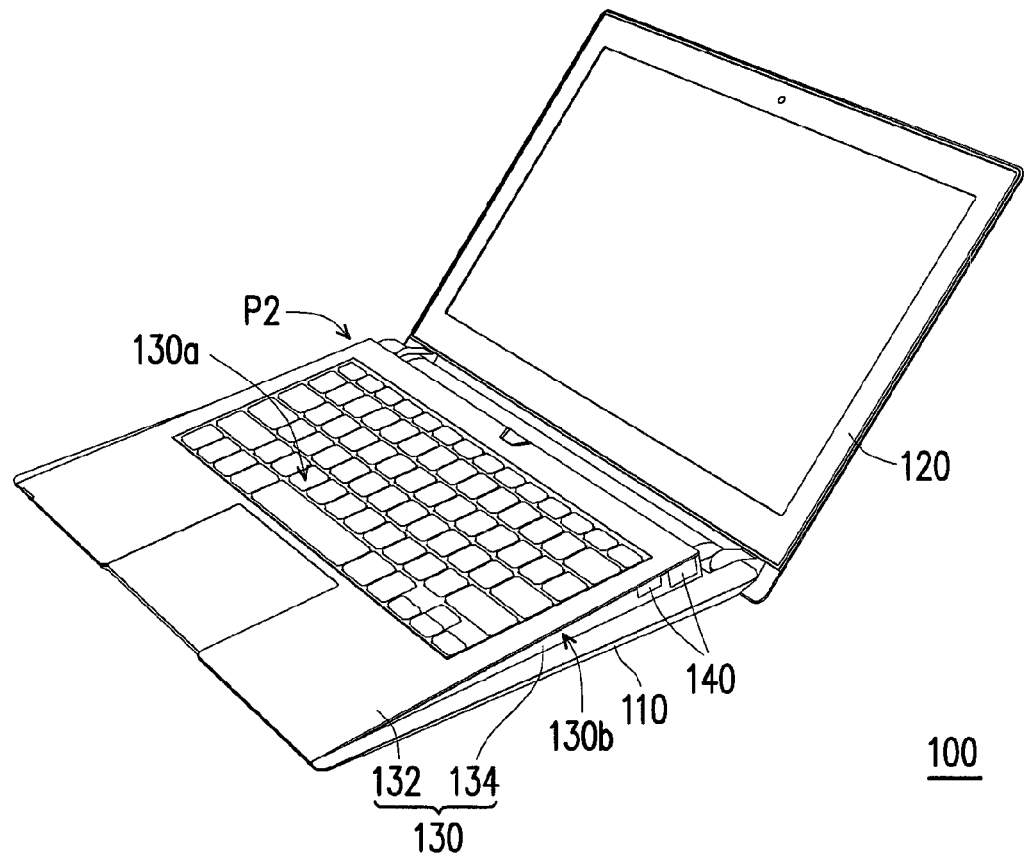
FIG. 1B is a stereogram of a second body in FIG. 1A unfolding from the first body.
Figure 2A:
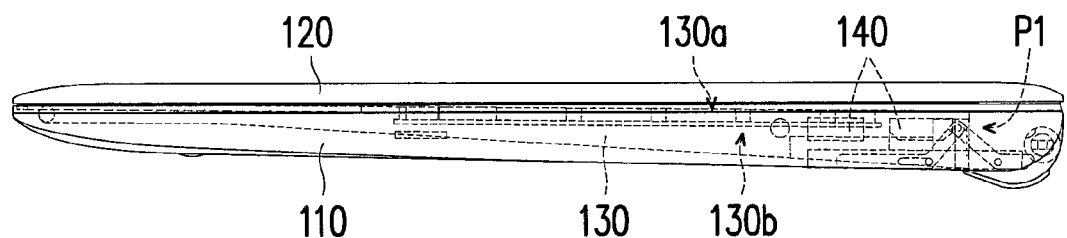
FIG. 2A is a side view of an electronic device in FIG. 1A.
Figure 2B:
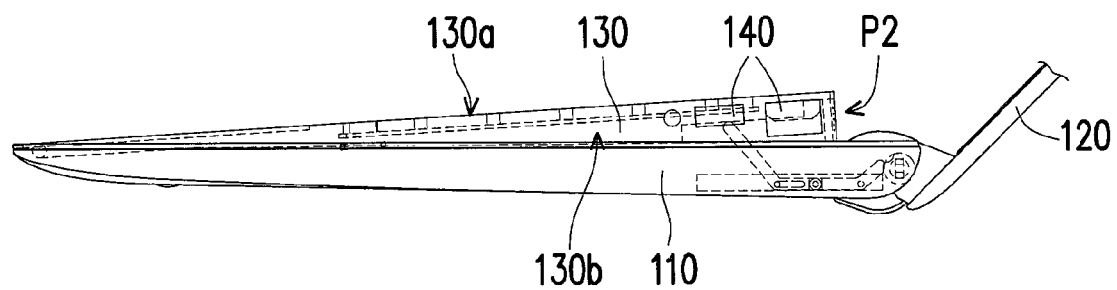
FIG. 2B is a side view of an electronic device in FIG. 1B.

FIG. 1A is a stereogram of an electronic device in one embodiment of the invention. FIG. 1B is a stereogram of a second body in FIG. 1A unfolding from the first body. FIG. 2A is a side view of an electronic device in FIG. 1A. FIG. 2B is a side view of an electronic device in FIG. 1B. Please refer to FIGS. 1A to 2B. An electronic device 100 in the embodiment includes a first body 110, a second body 120, an input module 130, and at least one functional element 140 (two are illustrated). In the embodiment, the electronic device 100 is, for example, a notebook computer. The first body 110 and the second body 120 are, for example, a host of the notebook computer and a display monitor, respectively. The functional element 140 is, for example, a connection port which is disposed on the input module 130 for users to plug in an external device or a connection wire.

The input module 130, for example, includes a keyboard which is movably disposed on the first body 110 and electrically connected to a motherboard in the host (the first body 110) of the notebook computer. The input module 130 is, for example, pivoted to the first body 110 and adapted to rotate relative to the first body 110 to be moved between a first position P1 as shown in FIG. 2A and a second position P2 as shown in FIGS. 1B and 2B. When the input module 130 is located at the first position P1, the functional element 140 is concealed in the first body 110. When the input module 130 is located at the second position P2, the functional element 140 is exposed outside the first body 110.

With the abovementioned disposition, the input module 130 may be moved relative to the first body 110 of the electronic device 100 to allow the functional element 140 to be concealed in the first body 110 of the electronic device 100 as shown in FIG. 2A or to be exposed outside the first body 110 as shown in FIGS. 1B and 2B via the movement of the input module 130. Accordingly, the user may allow the functional element 140 to be exposed outside the first body 110 of the electronic device 100 when using the functional element 140 and allow the functional element 140 to be concealed in the first body 110 of the electronic device 100 when the functional element 140 is not in use, so as to prevent the functional element 140 from being contaminated by dirt or liquid as well as to allow the electronic device 100 to have a better appearance. In addition, since the functional element 140 is not disposed on the side surface of the first body 110 of the electronic device 100, the side surface of the first body 110 of the electronic device 100 may have a smaller thickness to be advantageous for light and slim design.

In the embodiment, for example, the second body 120 is used to drive the input module 130 to move between the first position P1 and the second position P2. Specifically, when the second body 120 covers the first body 110 as shown in FIGS. 1A and 2A, the input module 130 is located at the first position P1. When the second body 120 rotates relative to the first body 110 as shown in FIGS. 1B and 2B so that an included angle between the second body 120 and the first body 110 is greater than a specific angle, the second body 120 drives the input module 130 to move to the second position P2. Accordingly, when the user unfolds the second body 120 from the first body 110 in order to operate the electronic device 100, the input module 130 is moved from the first position P1 to the second position P2 as the included angle between the second body 120 and the first body 110 increases. Therefore, the functional element 140 is exposed outside the first body 110 to allow the user to plug in the external device or the connection wire. The specific angle is in, for example, 45 degrees, 60 degrees, or other appropriate degrees. The invention is not limited thereto.

In addition, the input module 130 has an input surface 130a. When the second body 120 drives the input module 130 to rotate relative to the first body 110 from the first position P1 to the second position P2, the input surface 130a of the input module 130 is tilted so that the user is able to operate the input surface 130a in a more comfortable angle.

Please refer to FIG. 1B. In the embodiment, the input module 130 includes an input module main body 132 and a shell body 134. The input module main body 132 is, for example, a keyboard. The shell body 134 is movably connected to the first body 110 in a pivot manner. The input module main body 132 and the functional element 140 are fixed on the shell body 134. By comparison, a conventional keyboard of the notebook computer is disposed on the host and unmovable, whereas in the embodiment, a movable shell body 134 is disposed on the first body 110 and, the input module main body 132 as well as the functional element 140 are fixed on the shell body 134, so that the input module main body 132 may be tilted as shown in FIG. 1B with the actuation of the shell body 134 relative to the first body 110. Moreover, the functional element 140 may be exposed outside the first body 140 as shown in FIG. 1B with the actuation of the shell body 134 relative to the first body 110.

In the embodiment, the input module 130 has a side surface 130b, and the functional element 140 is disposed on the side surface 130b of the input module 130. When the input module 130 is located at the first position P1, the side surface 130b of the input module 130 is located inside the first body 110 as shown in FIG. 2A so that the functional element 140 is concealed. When the input module 130 is moved from the first position P1 to the second position P2, the input module 130 drives the side surface 130b thereof to rise relative to the first body 110 and the side surface is exposed outside the first body 110 as shown in FIGS. 1B and 2B.

Figure 3A:
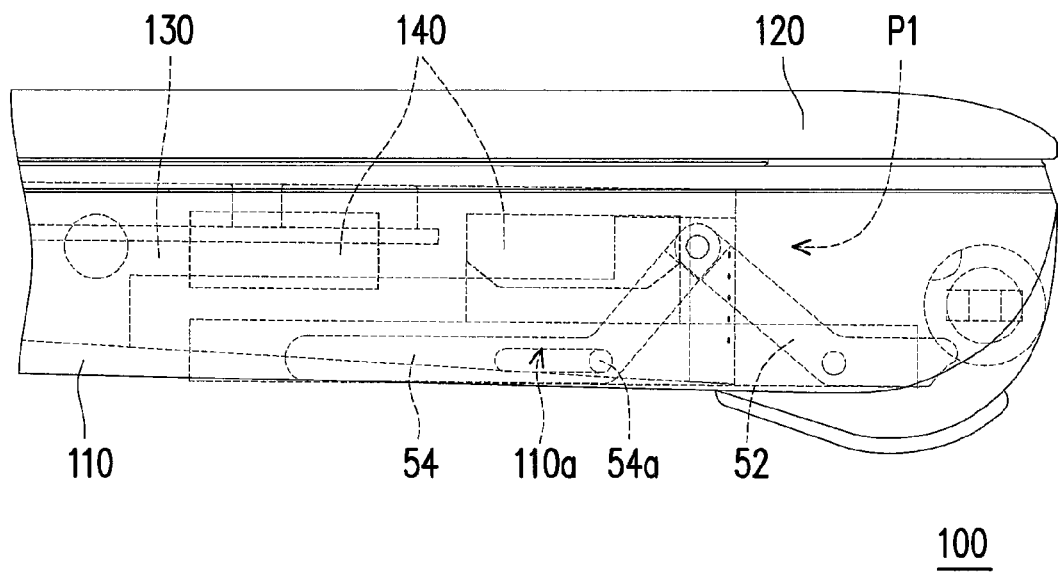
FIG. 3A is a local side view of the electronic device in FIG. 2A.
Figure 3B:
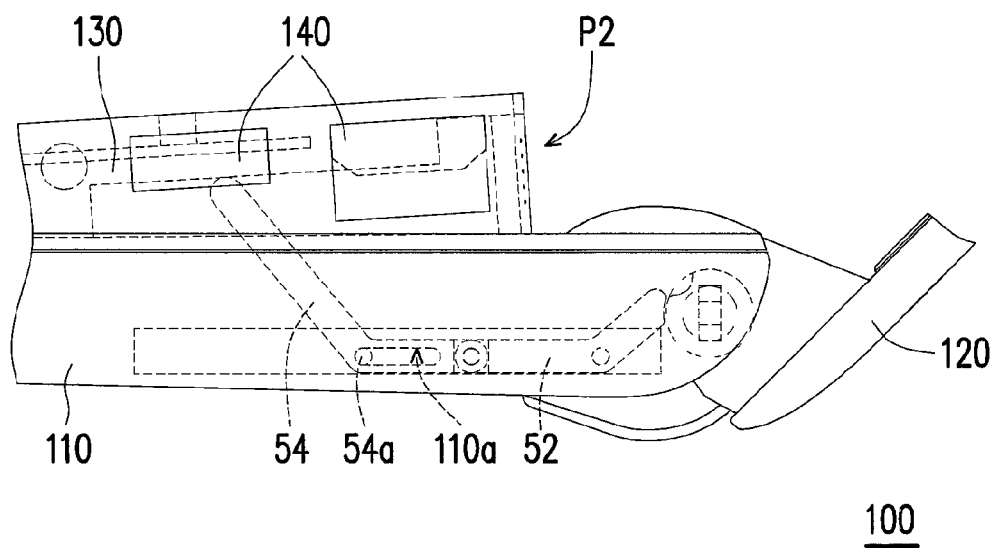
FIG. 3B is a local side view of the electronic device in FIG. 2B.

FIG. 3A is a local side view of the electronic device in FIG. 2A. FIG. 3B is a local side view of the electronic device in FIG. 2B. Please refer to FIGS. 3A and 3B. More specifically, the electronic device 100 in the embodiment has a first rod 52 and a second rod 54 in the first body 110. The first rod 52 is pivoted to the first body 110, and the second rod 54 is pivoted to the first rod 52. When the second body 120 rotates from a status as shown in FIG. 2A to a status as shown in FIG. 2B, the second body 120 drives the first rod 52 to move. Moreover, the first rod 52 drives the second rod 54 to rotate from a status as shown in FIG. 3A to a status as shown in FIG. 3B so that the input module 130 is pushed upward from the first position P1 to the second position P2 by the second rod 54, thereby allowing the functional element 140 to be exposed outside the first body 110.

As shown in FIGS. 3A and 3B, the second rod 54 has a bump 54a, and the first body 110 has a slide groove 110a. The bump 54a is arranged in a sliding manner in the slide groove 110a. The bump 54a is adapted to slide between a position as shown in FIG. 3A and a position as shown in FIG. 3B along the slide groove 110a so that the first rod 52 and the second rod 54 are actuated in a manner as shown in FIGS. 3A and 3B. In the embodiment, the second body 120, for example, drives the first rod 52 to move via a gear. However, the invention is not limited thereto. In other embodiments, the second body

120 may drive the first rod 52 to move via other appropriate components. In addition, in other embodiments, other appropriate mechanism designs may be utilized to achieve the effect of promoting the input module 130 to be moved. The invention is not limited thereto.

Figure 4A:
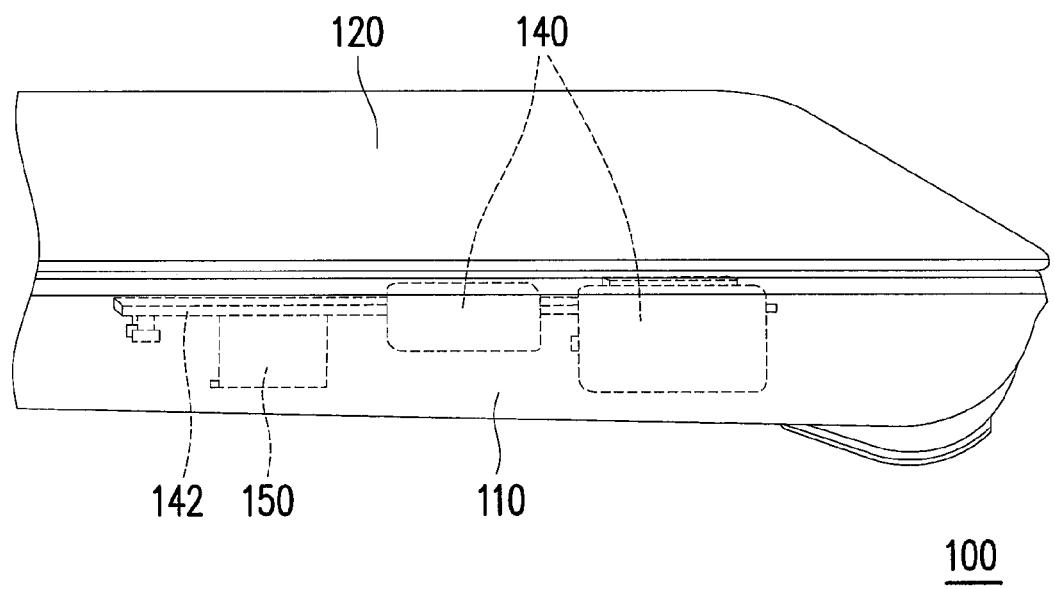
FIG. 4A is a local enlargement of the electronic device in FIG. 2A.
Figure 4B:
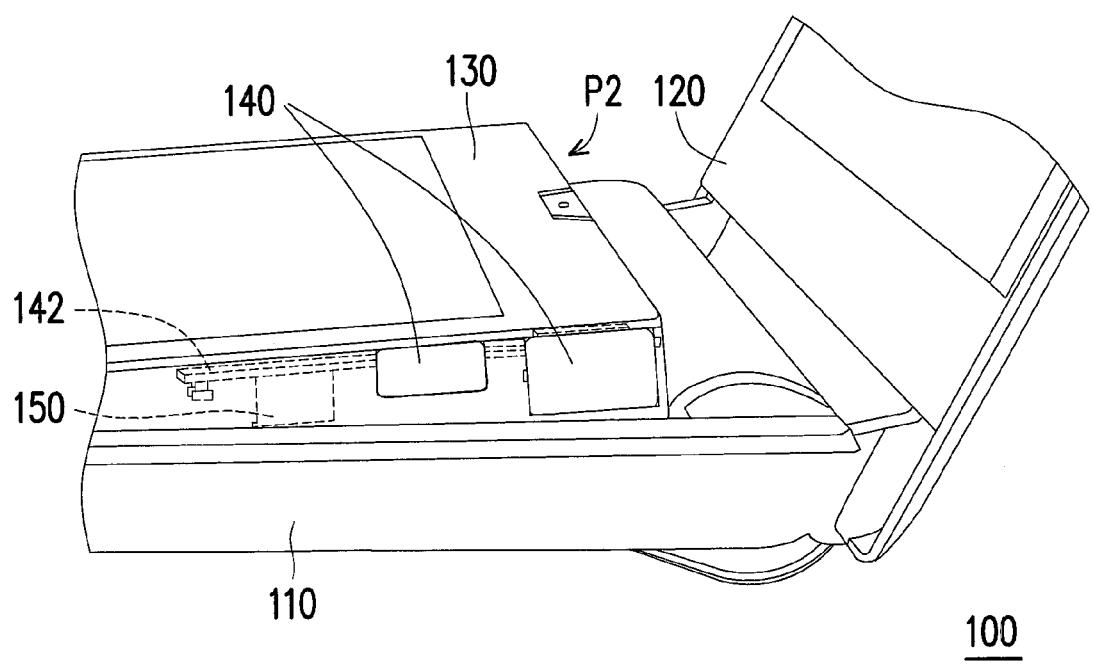
FIG. 4B is a local enlargement of the electronic device in FIG. 2B.

FIG. 4A is a local enlargement of the electronic device in FIG. 2A. FIG. 4B is a local enlargement of the electronic device in FIG. 2B. Please refer to FIGS. 4A and 4B. In the embodiment, the electronic device 100 further includes a flexible printed circuit board 150. The flexible printed circuit board 150 is connected between the functional element 140 and the first body 110. For example, the flexible printed circuit board 150 is connected between a circuit board 142 of a connection port (the functional element 140) and a motherboard in a host (the first body 110) of the notebook computer. With the flexibility characteristic of the flexible printed circuit board 150, when the input module 130 is moved between the first position P1 as shown in FIG. 2A and the second position P2 as shown in FIG. 2B, the flexible printed circuit board 150 flexes correspondingly so that the input module 130 may actuate smoothly and an electrical connection between the functional element 140 and the first body 110 is maintained.

Figure 5A:
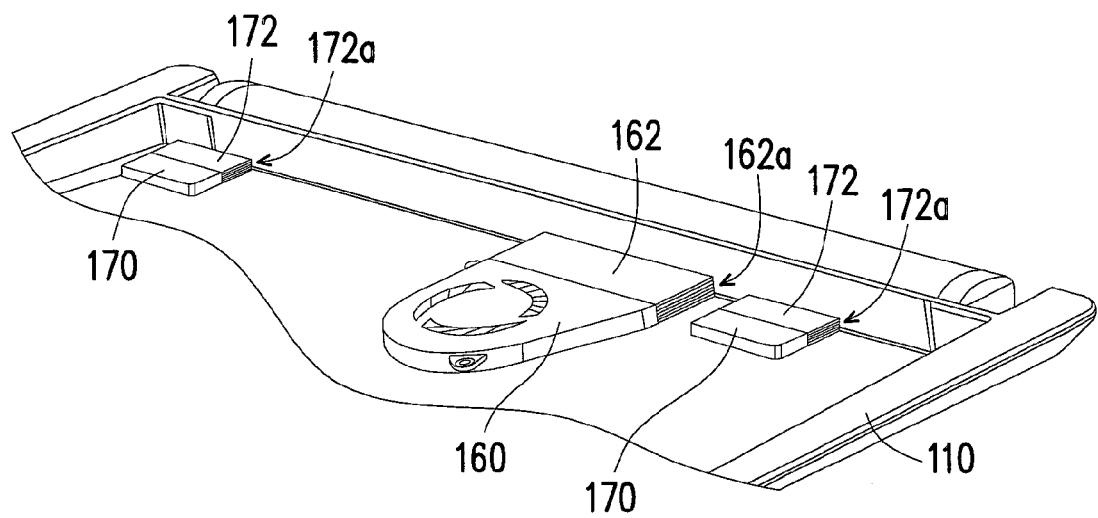
FIG. 5A is a stereogram of a partial component of the electronic device in FIG. 2A.
Figure 5B:
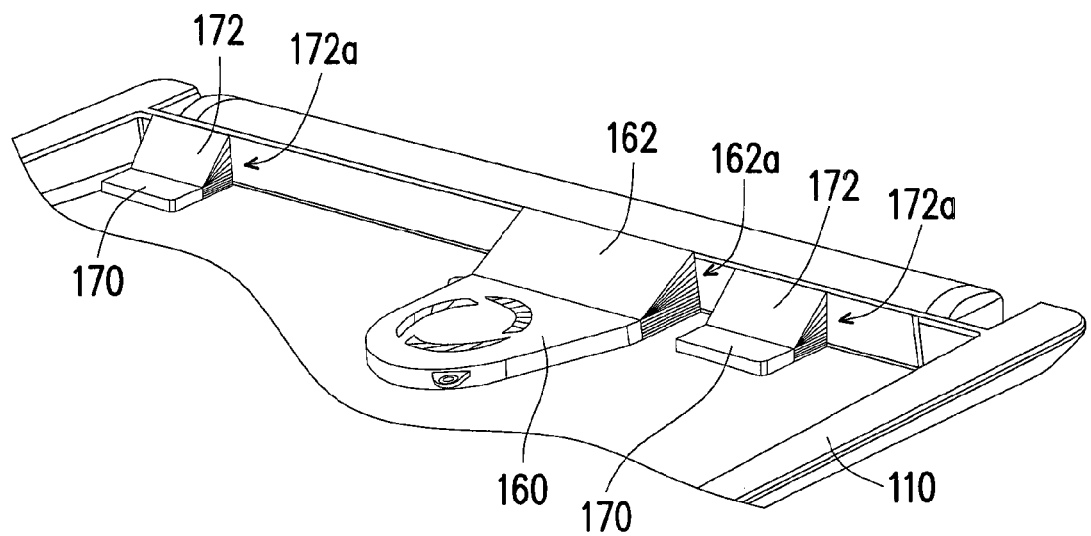
FIG. 5B is a stereogram of a partial component of the electronic device in FIG. 2B.

FIG. 5A is a stereogram of a partial component of the electronic device in FIG. 2A. FIG. 5B is a stereogram of a partial component of the electronic device in FIG. 2B. In order to make the drawings more comprehensible, the second body 120 and the input module 130 as shown in FIGS. 2A and 2B are not illustrated in FIGS. 5A and 5B. Please refer to FIGS. 5A and 5B. In the embodiment, the electronic device 100 (as marked in FIGS. 2A and 2B) further includes a fan 160 and at least one speaker 170 (two are illustrated). The fan 160 and each speaker 170 are fixed on the first body 110. An end of the fan 160 has a flexible cover body 162, and an end of each speaker 170 has a flexible cover body 172. The flexible cover body 162 is connected between the first body 110 and the input module 130 as shown in FIGS. 2A and 2B and has an outlet 162a. Each flexible cover body 172 is connected between the first body 110 and the input module 130 as shown in FIGS. 2A and 2B and has a sound export 172a. When the input module 130 is moved from the first position P1 as shown in FIG. 2A to the second position P2 as shown in FIG. 2B, the flexible cover body 162 and the flexible cover body 172 are expanded as the input module 130 rises, thereby enlarging the outlet 162a and each sound export 172a so that the electronic device 100 has good dissipation efficiency and sound exporting quality. The invention provides no limitation to the disposition location of the fan 160 and each speaker 170. In other embodiments, the fan 160 and each speaker 170 may be disposed on the input module 130.

To sum up, the functional element of the invention is disposed on the input module which may be moved relative to the body of the electronic device so that the functional element may be concealed in the body of the electronic device or exposed outside the body via the movement of the input module. Accordingly, the users may allow the functional element to be exposed outside the body of the electronic device when they would like to use the functional element, and allow the functional element to be concealed in the body of the electronic device when the functional element is not in use, so as to prevent the functional element from being contaminated by dirt or liquid as well as to allow the electronic device to have a better appearance. In addition, since the functional element is not disposed on the side surface of the body of the electronic device, the side surface of the body of the electronic device may have a smaller thickness to be advantageous for light and slim design. Furthermore, when the second body is expanded from the first body and then drives the input module to be moved, the input surface of the input module is driven to be tilted so that the user is able to operate the input surface in a more comfortable angle, thereby increasing the comfort of operating the electronic device.

Although the invention has been disclosed by the above embodiments, the embodiments are not intended to limit the invention. It will be apparent to those skilled in the art that various modifications and variations can be made to the structure of the invention without departing from the scope or spirit of the invention. Therefore, the protecting range of the invention falls in the appended claims.

What is claimed is:

1. An electronic device, comprising:
a first body;
an input module, movably disposed on the first body and adapted to be moved between a first position and a second position, wherein an user is able to operate the input module at the second position; and
a functional element, disposed on the input module, wherein when the input module is located at the first position, the functional element is concealed in the first body, and when the input module is located at the second location, the functional element is exposed outside the first body and is capable of connecting an external device.

2. The electronic device according to claim 1, wherein the input module is a keyboard.

3. The electronic device according to claim 1, wherein the functional element is a connection port.

4. The electronic device according to claim 1, further comprising a second body, wherein the second body is pivoted to the first body, when the second body covers the first body, the input module is located at the first position, and when the second body rotates relative to the first body so that an included angle between the second body and the first body is greater than a specific angle, the second body drives the input module to move to the second position.

5. The electronic device according to claim 1, wherein the input module is pivoted to the first body and has an input surface, and the input module is adapted to rotate relative to the first body from the first position to the second position so as to drive the input surface to be tilted.

6. The electronic device according to claim 1, wherein the input module has a side surface, the functional element is disposed on the side surface, when the input module is located at the first position, the side surface is located in the first body, and when the input module is moved from the first position to the second position, the input module drives the side surface to rise relative to the first body and the side surface is exposed outside the first body.

7. The electronic device according to claim 1, wherein the electronic device further comprises a flexible printed circuit board connected between the functional element and the first body.

8. The electronic device according to claim 1, further comprising a fan, wherein the fan is fixed on the first body or the input module, an end of the fan has a flexible cover body connected between the first body and the input module and having an outlet, and when the input module is moved from the first position to the second position, the flexible cover body is expanded and then the outlet is enlarged.

9. The electronic device according to claim 1, further comprising a speaker, wherein the speaker is fixed on the first body or the input module, an end of the speaker has a flexible cover body connected between the first body and the input module and having a sound export, and when the input module is moved from the first position to the second position, the flexible cover body is expanded and then the sound export is enlarged.

10. The electronic device according to claim 1, wherein the input module comprises:
   an input module main body; and
   a shell body, movably connected to the first body, wherein the input module main body and the functional element are fixed on the shell body.

* * * * *